United States Patent [19]

Tanaka et al.

[11] Patent Number: 4,661,994
[45] Date of Patent: Apr. 28, 1987

[54] FREQUENCY AND VOLUME DISPLAY FOR A RECEIVER

[75] Inventors: Masanobu Tanaka; Takeru Tani, both of Kanagawa, Japan

[73] Assignee: Sony Corporation, Tokyo, Japan

[21] Appl. No.: 810,242

[22] Filed: Dec. 18, 1985

[30] Foreign Application Priority Data

Dec. 28, 1984 [JP] Japan ................................ 59-280070

[51] Int. Cl.⁴ ............................................. H04B 1/16
[52] U.S. Cl. .................................... 455/157; 455/159; 455/200; 381/12
[58] Field of Search ........................ 455/154, 157–159, 455/200; 358/192.1; 381/12, 104

[56] References Cited

U.S. PATENT DOCUMENTS

| 3,956,594 | 5/1976 | Hirata | 381/12 |
| 4,135,158 | 1/1979 | Parmet | 455/159 |
| 4,227,254 | 10/1980 | Bauer | 455/154 |
| 4,270,216 | 5/1981 | Suzuki et al. | 455/159 |
| 4,292,467 | 9/1981 | Odlen et al. | 455/159 |
| 4,340,908 | 7/1982 | Wakabayashi et al. | 455/159 |
| 4,602,379 | 7/1986 | Ecklund | 381/12 |

Primary Examiner—Jin F. Ng
Attorney, Agent, or Firm—Lewis H. Eslinger; Alvin Sinderbrand

[57] ABSTRACT

A receiver having a tuner for tuning to a desired broadcast station and connected with a detector through which a demodulated signal is supplied as an input signal to a function selector which receives at least one other input signal from another source thereof and which selects either the demodulated signal or the other input signal as the output signal therefrom, a tuning control for selecting the broadcast frequency to which the tuner is adjusted and a volume control for adjusting the volume of the output signal from the function selector; is provided with a common display device, desirably constituted by a row of bar-type display elements, which selectively displays either the broadcast frequency, when the function selector selects the demodulated input signal, or the volume level when the function selector selects the other input signal or when the volume control effects a change in the volume level.

12 Claims, 5 Drawing Figures

FREQUENCY AND VOLUME DISPLAY FOR A RECEIVER

BACKGROUND OF THE INVENTION

1. Field of the Invention

This invention relates generally to a receiver which can receive various inputs, for example, AM and FM broadcast signals, and more particularly is directed to a frequency and volume display for such receiver.

2. Description of the Prior Art

Presently available receivers which can receive AM and FM broadcasts generally include a panel provided with a number of display devices for separately displaying many different kinds of information, such as, the broadcast frequency for which the receiver has been tuned, the adjusted volume level of the output of the receiver, the balance or relative levels of the stereo right and left components of the output signals, and so on. Since many different types of information are displayed within a limited space on the control panel of the receiver, it is not easy for the user to easily distinguish between, or discriminate, the different types of information being displayed.

Further, in receivers of the phase locked loop (PLL) synthesizer-type, for example, as disclosed in U.S. Pat. No. 4,092,594, it is desirable to provide on the control panel simultaneous analog and digital displays of the broadcast or receiving frequency to which the receiver has been tuned. Such simultaneous digital and analog displays of the broadcast frequency merely add to the confusion resulting from the additional separate displays indicating the nature of the input to the receiver, that is, AM or FM broadcasts or an auxiliary input, the volume level of the output, the balance state in the event of a stereo output, and the states of the treble and base tone controls. Therefore, existing receivers have not, as yet, been provided with an effective, easily read arrangement for displaying the various types of information of interest to the user of the receiver.

OBJECTS AND SUMMARY OF THE INVENTION

Accordingly, it is an object of this invention to provide a receiver in which at least the receiving or broadcast frequency and a volume level or balance state are displayed on a common display device so as to be easily read.

It is another object of this invention to provide a receiver with a display arrangement, as aforesaid, which can be manufactured at relatively low cost, and which provides the user with improved access to the displayed information.

In accordance with an aspect of this invention, a receiver is provided with tuning means for tuning to a desired broadcast station within a predetermined frequency band and which is connected with a tuning control for selecting the broadcast frequency of the desired station, a detector connected to the tuning means for producing a demodulated signal supplied to one input of a function selector which receives at least one other input signal from another source thereof and which is operative to provide either the demodulated signal or the other input signal as an output signal from the function selector, a volume control for adjusting the volume of the output signal from the function selector, a common display device, and a display control connected with the tuning control and the volume control and being operative to selectively display on the common display device either the broadcast frequency of the selected broadcast station or the volume and/or balance of the output from the function selector.

It is a feature of this invention that the display control, which desirably includes a microcomputer, causes the display device to normally display the broadcast frequency when the function selector selects the demodulated signal as the output signal therefrom, whereas the display control causes the display device to display the volume or level of the output from the function selector for a predetermined time whenever the volume control adjusts the volume of such output signal and, at the conclusion of such predetermined time, causes the display device to return to displaying of the broadcast frequency. On the other hand, when the function selector selects the other or auxiliary input signal as the output signal therefrom, the display control causes the common display device to display the volume and/or balance of the output signal from the function selector.

The above, and other objects, features and advantages of the present invention, will be apparent in the following detailed description of a preferred embodiment thereof which is to be read in conjunction with the accompanying drawings in which the same reference numerals are employed for identifying the corresponding parts on the several views.

DESCRIPTION OF THE PREFERRED EMBODIMENT

Figure 2:
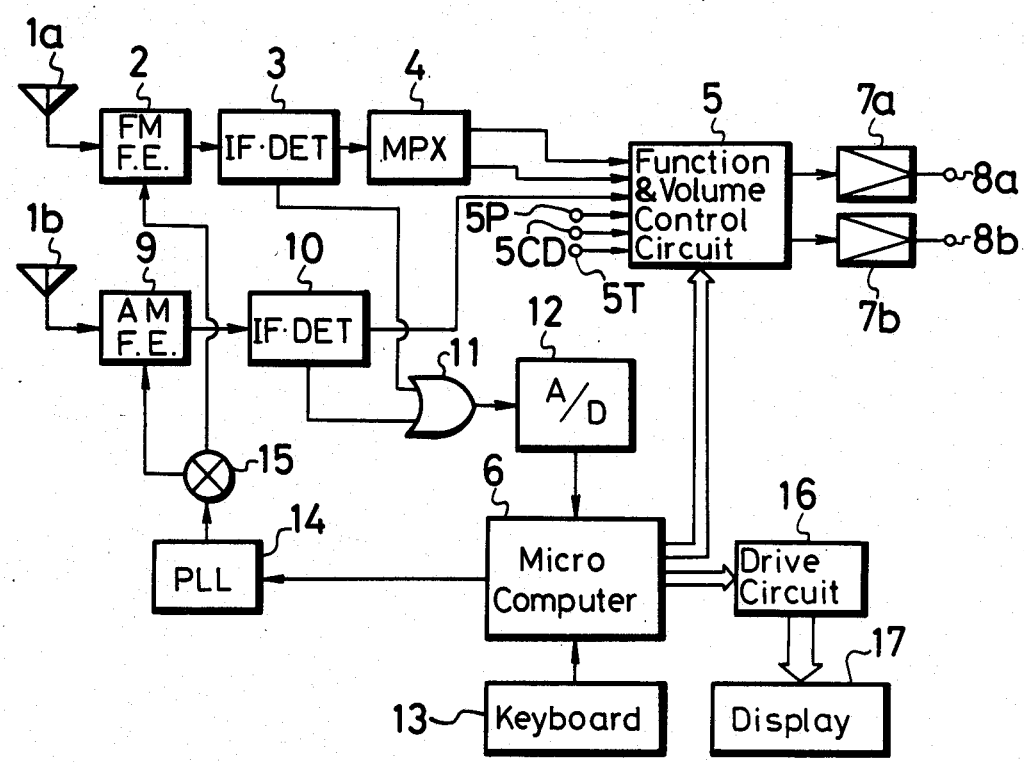
FIG. 2 is a block diagram illustrating a type of AM/FM receiver to which the display arrangement of FIG. 1 may be advantageously applied.

Referring initially to FIG. 2, it will be seen that a receiver of a type to which the present invention may be desirably applied has an FM broadcast receiving antenna 1a and an AM broadcast receiving antenna 1b. The FM broadcast signals received by antenna 1a are supplied to an FM front end circuit 2. The output signal from FM front end circuit 2 is supplied through an intermediate frequency (IF) amplifier/FM detector circuit 3 to a stereo multiplex demodulator circuit 4. The stereo left and right components or audio signals from stereo multiplex demodulator circuit 4 are supplied to respective inputs of a function selector and volume control circuit 5.

The AM broadcast signals received by antenna 1b are supplied to an AM front end circuit 9. The output signal from AM front end circuit 9 is supplied to an intermediate frequency (IF) amplifier/AM detector circuit 10. The output signal from IF amplifier/AM detector circuit 10 is applied to another input of function selector and volume control circuit 5. The circuit 5 is further shown to be provided with input terminals 5P, 5CD and 5T to which are supplied audio signals from a phonograph record player, a CD (compact disc) player, and a cassette tape player, respectively. The function selector and volume control circuit 5 is operative, in response to a function selecting signal and a volume control signal from a microcomputer 6, to select, from among the various described input signals, the output signal to be supplied from circuit 5 through low frequency or audio amplifiers 7a and 7b to output terminals 8a and 8b, respectively, and also to control the volume level of the output signal.

The output signals from IF amplifier/FM detector circuit 3 and IF amplifier/AM detector circuit 10 are also supplied through an OR circuit 11 to an analog-to-digital (A/D) converter circuit 12. The digital signal developed at the output of A/D converter circuit 12, and which corresponds to the frequency of the received broadcast signal is supplied to microcomputer 6. A control signal provided by microcomputer 6 in response to a tuning signal selected by actuation of a keyboard 13 and in response to the digital output signal from A/D converter circuit 12 is supplied to a phase locked loop (PLL) circuit 14 which constitutes a local oscillator circuit. Thus, PLL circuit 14 provides a local oscillation frequency controlled by microcomputer 6 and which is selectively supplied through a change-over switch 15 to FM front end circuit 2 or AM front end circuit 9. Thus, by manipulating suitable push-button switches included in keyboard 13 for selecting the broadcast frequency to which the FM or AM front end circuit 2 or 9 is to be tuned, and by suitably positioning or conditioning the change-over switch 15, a desired broadcast station can be received.

The above generally described AM/FM receiver employing a microcomputer controlled PLL synthesizer for providing the local oscillation signal for the tuner may be of a type disclosed fully in U.S. Pat. No. 4,298,851 having a common assignee herewith, and hence will not be described in any greater detail herein.

A function selecting signal and a volume control signal provided by microcomputer 6 in response to selective manipulation of keyboard 13 are supplied to function selector and volume control circuit 5, so that the audio signals delivered through circuit 5 and amplifiers 7a and 7b to output terminals 8a and 8b are changeably selected in response to the function selecting signal while the volume levels thereof are control in response to the volume controlled signal. Further, a display signal is suitably supplied from microcomputer 6 through a drive circuit 16 to a display apparatus 17 which is mounted on the front panel of the receiver. Such display apparatus 17 may have the arrangement shown on FIG. 1 in which various characters, symbols, bar-type display elements and the like selected for energizing by signals from microcomputer 6 are displayed in suitably predetermined colors.

Figure 1:
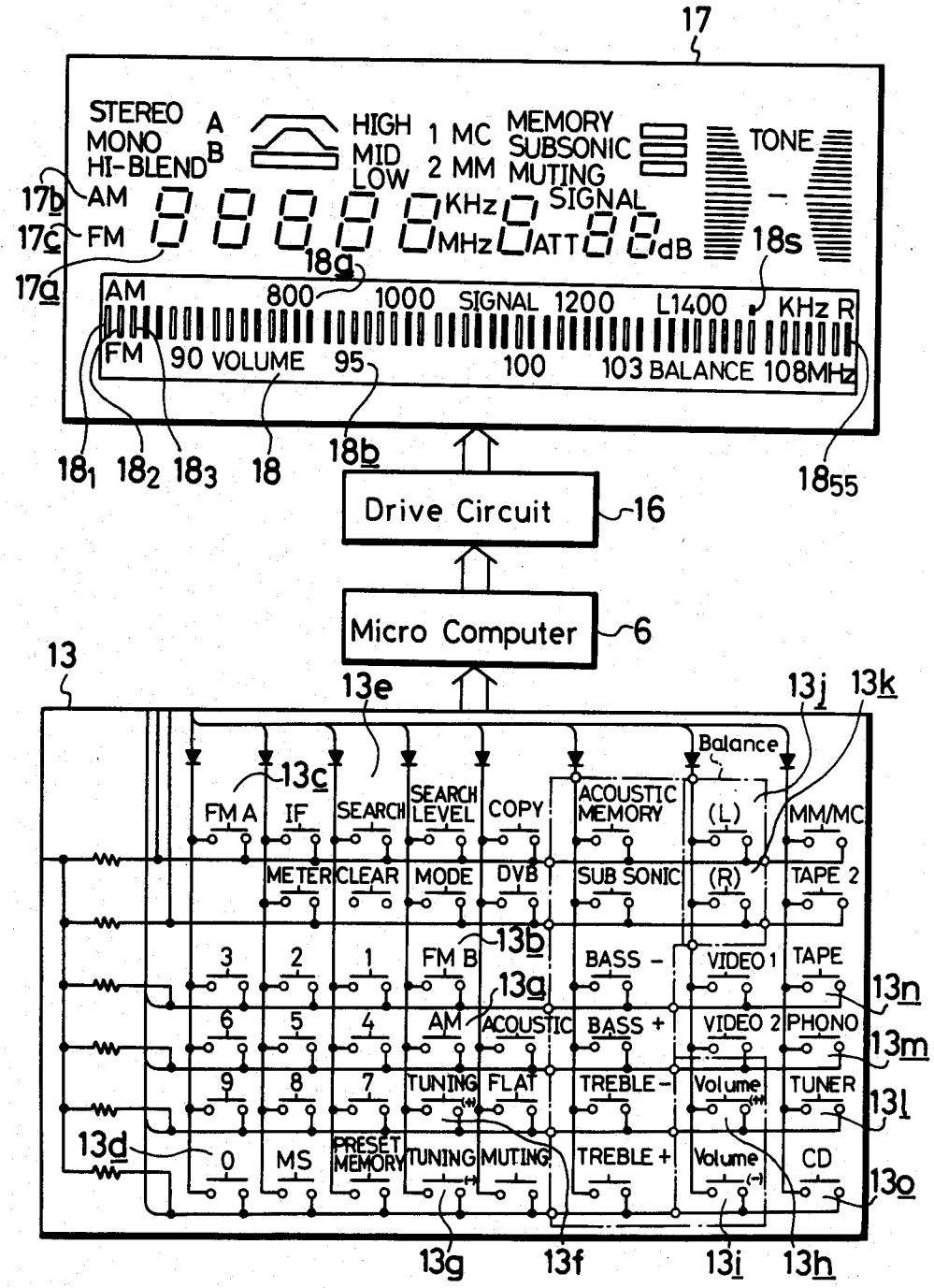
FIG. 1 is a circuit block diagram showing a display arrangement for a receiver according to an embodiment of the present invention.

In the embodiment of this invention illustrated on FIG. 1, the display apparatus 17 is shown to include a digital display 17a for displaying a broadcast frequency to which the receiver has been tuned, and which may be constituted by Nixie tubes or the like. Adjacent the digital display 17a, there are selectively energizable characters 17b and 17c for indicating whether the digital display refers to the frequency of AM or FM broadcast signals which are to be received.

In addition to the above described digital display 17a and other displays provided on the upper portions of display apparatus 17 the lower portion of display apparatus 17, is provided with an analog display device 18 comprised of, for example, 55 bar-type display elements $18_1, 18_2, -18_{55}$, each constituted, for example, by a light emission diode, and being arranged in a horizontal row with equal distances between the bar-type display elements and with the latter extending vertically in parallel, as shown. Scales 18a and 18b are provided above and below the row of bar-type display elements and indicate the frequencies of the AM and FM broadcast bands, respectively.

Figure 3A:
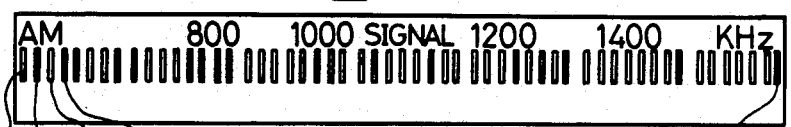
FIGS. 3A and 3B are diagrammatic views illustrating portions of the display arrangement of FIG. 1 and to which reference will be made in explaining operation of the display arrangement according to the invention.

When a user selects, for example, the AM broadcast reception mode as the desired function to be selected by circuit 5, for example, by actuating a push-button switch 13a on keyboard 13, the bar-type display elements of display device 18 which correspond to previously stored frequencies of the broadcast stations that can be received in the locale of the receiver, are made to flash and the character "AM" is displayed or energized at the end of the scale 18a. For example, if the receiver is located in Japan, the previously stored frequencies at which the bar-type display elements will be made to flash, as indicated in solid black on FIG. 3A, when the AM broadcast reception mode is selected, will be, for example, 595 kHz for the first channel of Japan Broadcasting Corporation, 693 kHz for the second channel of Japan Broadcasting Corporation, 810 kHz for the Far East Network, 954 kHz for the Tokyo Broadcasting System, Inc., 1134 kHz for Nippon Cultural Broadcasting Inc., and 1242 kHz for Nippon Broadcasting System Inc. On the other hand, when the user selects the FM broadcast reception mode by actuating a push- button switch 13b or 13c on keyboard 13, a similar operation will be carried out, but in that case, the bar-type display elements of display 18 that are made to flash will correspond to the previously stored broadcast frequencies of the FM stations that can be received, and the scale 18b and its respective character "FM" will be illuminated or energized.

Continuing with the operation of the display apparatus 17 in association with microcomputer 6, keyboard 13 and drive circuit 16 in accordance with the prior art, for example, as in U.S. Pat. No. 4,298,851, a keypad 13d of keyboard 13 having push-button switches or keys labelled "0" to "9" may be selectively actuated for entering or storing in a memory of microcomputer 6 data corresponding to the broadcast frequencies of the various stations that can be received in the locale of the receiver. Thereafter, a push-button switch or key 13e may be actuated for selecting a search mode by which microcomputer 6 causes PLL circuit 14 to change the broadcast frequency to which the receiver is tuned in a step-by-step manner from one to the next of the stored frequencies. Alternatively, push-button switches or keys 13f and 13g may be selectively actuated for causing computer 6 to effect either increasing or decreasing, respectively, of the broadcast frequency to which the receiver is tuned. In either case, that is, whether the broadcast frequency is changed in a search mode from one to another of the previously selected frequencies stored in the memory, or the broadcast frequency to which the receiver is tuned is increased or decreased gradually, the actual frequency to which the receiver is tuned is indicated at any time by the illumination or energizing of all of those bar-type display elements extending from the element $18_1$ at the left-hand end of display device 18 up to the bar-type display element which is adjacent the value on the scale 18a or 18b, as the case may be, to which the receiver is tuned. At the same time, the bar-type display elements of display device 18 which correspond to the stored frequencies of the broadcast stations that can be received in the locale of the receiver will continue to flash.

Figure 3B:
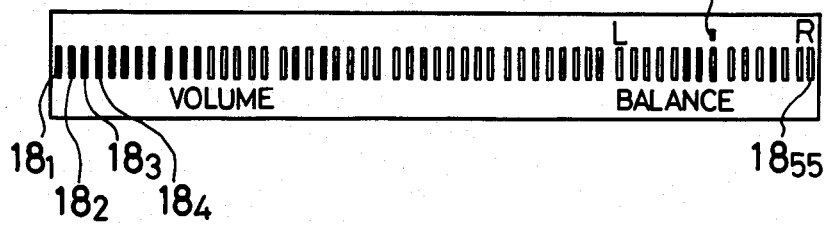

In accordance with the present invention, the above-described receiver according to the prior art further employs display device 18 for displaying the volume levels of the output signal from circuit 5 and the balance of the stereo right and left components of such output signal. More specifically, when the user operates or depresses push-button switches or keys 13h and 13i of keyboard 13 for increasing or decreasing, respectively, the volume of the output signal from circuit 5, microcomputer 6 causes display device 18 to display the adjusted level of the volume. In that case, and as shown on FIG. 3B, the legend "VOLUME" below the row of bar-type display elements is energized, to indicate that the device 18 is in its volume-display mode. In such volume-display mode, a number of the bar-type display elements $18_1, 18_2$,-etc., are made to flash, and the number of such flashing bar-type display elements increases from the left-hand end of the row in response to acutation of push-button switch 13h for increasing the volume of the output signal from circuit 5. On the other hand, in response to actuation of push-button switch 13i for decreasing the volume, the number of the flashing bar-type display elements $18_1, 18_2$,-etc., is decreased in the direction toward the left-hand end at which element $18_1$ is situated.

Further, when one or the other of push-button switches or keys 13j and 13k of keyboard 13 is actuated or depressed for changing the balance of the left and right-hand stereo component signals from circuit 5, microcomputer 6 establishes the balance-display mode of the display device 18. In such balance-display mode, as also shown on FIG. 3B, the legend "BALANCE" underlying the right-hand portion of display 18 is energized or illuminated to indicate that the respective mode has been established. Further, in the balance-display mode, a balanced index 18s disposed above the right-hand portion of display 18 and characters "L" and "R" equally spaced from index 18s at opposite sides thereof are energized or illuminated. Moreover, in the balance-display mode, one of the bar-type display elements in the right-hand portion of display 18 between the characters "L" and "R" is made to flash and indicates, by its position relative to balanced index 18s, the relative levels of the left and right stereo component signals issuing from circuit 5. When the level of the right stereo component signal is larger than that of the left stereo component signal, one of the bar-type display elements of display 18 situated between index 18s and character "R" will be made to flash with the distance from the flashing display element to the balanced index 18s corresponding to the difference between the right and left stereo component signals. Conversely, when the level of the left stereo component signal is higher than that of the right stereo component signal, the flashing bar-type display element will be situated between the character "L" and the central or balanced index 18s. Of course, in response to the actuation of push-button switch or key 13j, the bar-type display element which is made to flash moves gradually toward the left, that is, toward character "L". On the other hand, when key 13k is actuated, the flashing bar-type display element moves in the direction toward character "R". Moreover, when the levels of the right and left stereo component signals are equal or balanced, the bar-type display element in line with the balanced index 18s is made to flash.

Referring again to FIG. 1, it will be seen that the keyboard 13 further includes keys or push-button switches 13l, 13m, 13n and 13o which can be selectively actuated for establishing respective functions of the receiver. Thus, for example, microcomputer 6 responds to actuation of key 13l for causing circuit 5 to select the tuner function, that is, either AM or FM broadcast reception. On the other hand, microcomputer 6 responds to the selective actuation of keys 13m, 13n and 13o by causing circuit 5 to select as its input the input terminal 5P, 5T or 5CD and thereby to select a phonograph record player function, a cassette tape player function or a compact disc player function.

In accordance with the present invention, when any of the above-described functions other than the tuner function for AM or FM broadcast reception is selected, display device 18 is controlled by microcomputer 6 so as to continuously display the volume level and the balance of the stereo right and left component signals, as described above with reference to FIG. 3B. However, when the tuner function is selected for either AM or FM broadcast reception, display device 18 is controlled by microcomputer 6 so as to normally operate for indicating the broadcast frequency or station to which the receiver is tuned, as previously described with reference to FIG. 3A. Moreover, with the receiver in its AM or FM broadcast reception mode, if the user actuates either one of the volume control push-button switches or keys 13h and 13i, or one of the balance control push-button switches or keys 13j and 13k, microcomputer 6 causes display device 18 to display the adjusted volume and/or the adjusted balance state, as shown on FIG. 3B, for a predetermined time, for example, for a period of one second, and then to cause the display device 18 to return to its normal displaying of the broadcast frequency.

Figure 4:
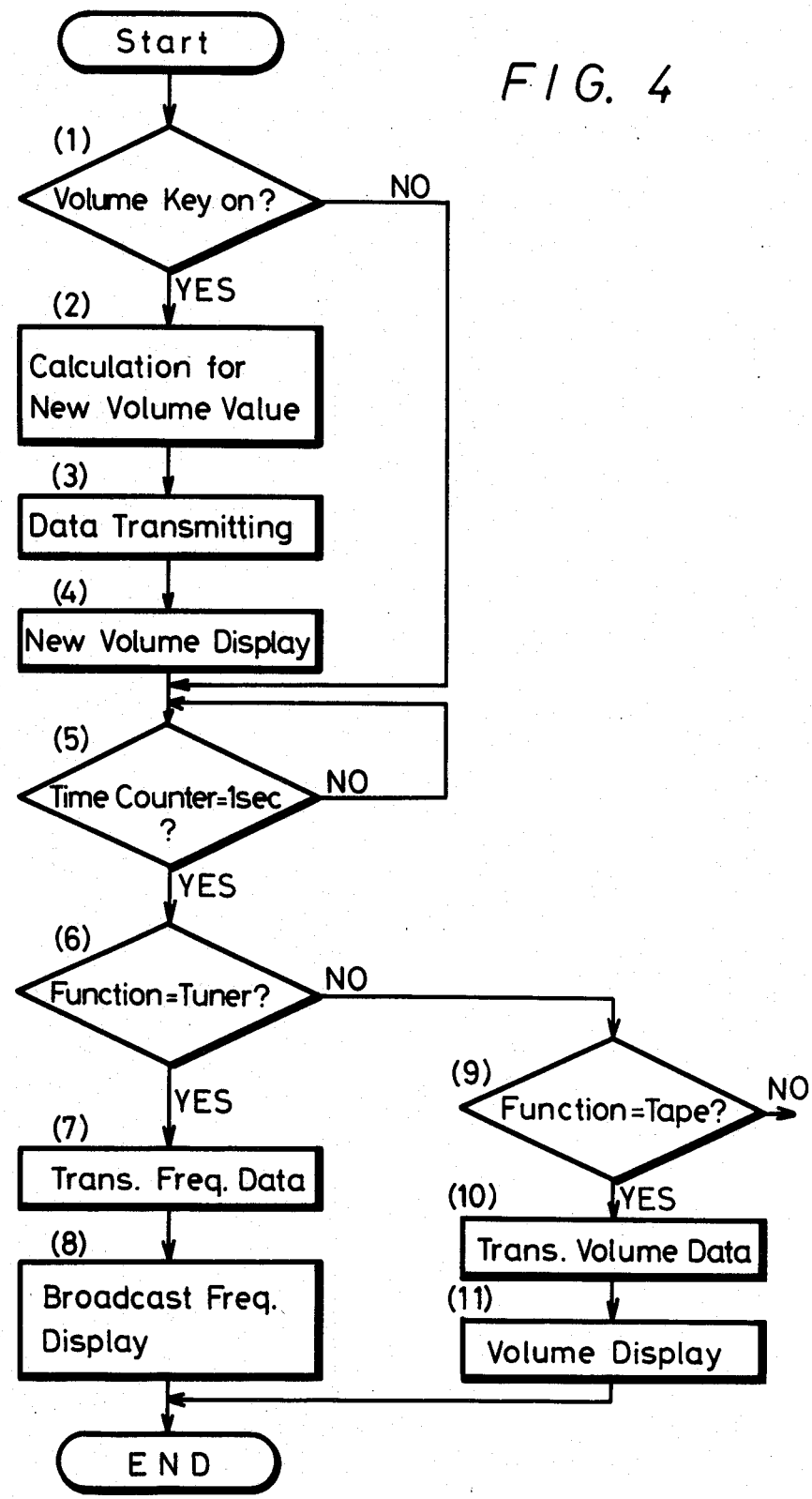
FIG. 4 is a flow chart to which reference will be made in explaining the operation of the display arrangement according to this invention for displaying a broadcast frequency and a volume level under the control of a microcomputer.

Referring now to FIG. 4, it will be seen that, in a program routine for the control of display apparatus 17 by microcomputer 6 so as to selectively display the broadcast receiving frequency, the volume level or the balance state of the right and left stereo component signals by means of the single display device 18, immediately after the start of the routine the program goes to step (1) where it is determined whether the volume control key 13h or 13i has been depressed for increasing or decreasing the volume of the output signal from circuit 5. If one of the keys 13h and 13i has been depressed, the program goes to step (2) in which microcomputer 6 calculates the new value of the volume. On the other hand, if in step (1) it is determined that neither of the keys 13h and 13i has been depressed, the routine proceeds to step (5) which will be later described.

In the next step (3) the new value of the volume calculated by microcomputer 6 is transmitted to drive circuit 16 which, in step (4) causes the new value of the volume to be displayed by display device 18, as previously described.

At the next step (5), a timer counter (not shown) checks whether a predetermined period of time, for example, one second, has elapsed since the display of the new value of the volume has commenced. Until one second has elapsed, the display of the new value of the volume is continued. However, when the predetermined time period has elapsed, that is, at the end of one second, the routine goes to step (6) in which it is determined whether the tuner function is selected by circuit 5, that is, if the receiver is in either its AM or FM broadcast reception mode. If it is determined that the tuner function is selected, the routine goes to step (7) in which broadcast receiving frequency data is transmitted from microcomputer 6 to drive circuit 16. Thereafter, in step (8), drive circuit 16 causes display device 18 to display the broadcast frequency for which the receiver is tuned, as previously described.

As earlier noted, if step (1) determines that neither of the keys 13h and 13i has been actuated or depressed for changing the volume of the output from circuit 5, the routine proceeds directly to step (5). Thus, after a delay of one second it is determined in step (6) whether the tuner function has been selected, and, in that event, the routine proceeds to cause the broadcast frequency to be displayed by display section 18, as earlier described.

In all cases, if it is determined at step (6) that the tuner function has not been selected, the routine goes to step (9). In step (9), it is determined whether the selected function is, for example, the tape player function and, if that is the case, microcomputer 6 transmits to drive circuit 16 in step (10) data corresponding to the present volume of the output from circuit 5, and the level of such present volume is displayed in display device 18 in step (11).

If the selected function is determined in step (9) to be other than the tape player function, for example, the compact disc player function, the level of the volume of the output from circuit 5 may be similarly displayed by display device 18.

Although the routine described above with reference to FIG. 4 is concerned specifically with the use of display device 18 for displaying both the broadcast frequency and the volume level, it will be appreciated that the described program routine can be similarly used for causing display device 18 to display both the broadcast frequency and the balance state of the right and left stereo components.

It will be appreciated that, in the above-described embodiment of the invention in which the single display device 18 serves as both the volume level display and the balance state display, as well as for the display of the broadcast frequency, all of those desired displays can be provided even if the space therefor is very limited. Furthermore, since the single display device 18 serves to display both the volume level and the balance state as well as the broadcast frequency, the numbers of parts required for such displays and the time required for their assembly are very substantially reduced as compared with apparatus in which separate display devices are employed. Therefore, a receiver or other apparatus embodying this invention can be relatively easily manufactured at relatively low cost.

Furthermore, although bar-type display elements $18_1, 18_2, -18_{55}$ arranged in a horizontal row have been included in the above-described embodiment of this invention, the row of such display elements can be arranged vertically or in any other direction, and other display elements, such as, dot-type display elements can be employed.

Having described a specific embodiment of this invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A receiver comprising:
    tuning means for tuning to a desired broadcast station within a predetermined frequency band;
    tuning control means connected to said tuning means for selecting the broadcast frequency of said desired broadcast station;
    detector means connected to said tuning means for producing a demodulated signal;
    function selector means having a plurality of inputs respectively supplied with said demodulated signal and with at least one other input signal from another source thereof, and being operative to provide either said demodulated signal or said other input signal as an output signal therefrom;
    volume control means connected to said function selector means for adjusting the volume of said output signal therefrom;
    a common display device; and
    display control means connected with said tuning control means and said volume control means and being operative to selectively display said broadcast frequency of the selected broadcast station and said volume on said common display device.

2. A receiver according to claim 1; in which said display control means causes said display device to normally display said broadcast frequency when said function selector means selects said demodulated signal as the output signal therefrom.

3. A receiver according to claim 2; in which said display control means causes said display device to display said volume for a predetermined time whenever said volume control means adjust the volume of said output signal and, at the conclusion of said predetermined time, causes said display device to return to the display of said broadcast frequency.

4. A receiver according to claim 3; in which said display control means causes said display device to display said volume when said function selector means selects said other input signal as said output signal therefrom.

5. A receiver according to claim 4; further comprising balance control means connected to said function selector for adjusting the relative levels of stereo right and left components of said output signal; and in which said display control means causes said display device to display said relative levels simultaneously with the display of said volume.

6. A receiver according to claim 5; in which said display device includes a plurality of selectively energized bar-type display elements arranged in a row; and in which a selected one of a group of said display elements adjacent one end of said row is energized to display said volume, and a selected one of another group of said display elements adjacent the other end of said row is energized to display said relative levels.

7. A receiver according to claim 6; in which said display control means includes a micro-computer.

8. A receiver according to claim 1; in which said display control means includes a micro-computer.

9. A receiver according to claim 1; in which said display device includes a plurality of selectively energized bar-type display elements arranged in a row, a broadcast frequency scale extending along said row and cooperating with a selected one of said bar-type display elements for indicating the broadcast frequency of said desired broadcast station, and another of said bar-type display elements is energizable for indicating said volume.

10. A receiver according to claim 9; further comprising balance control means connected to said function selector for adjusting the relative levels of stereo right and left components of said output signal; and in which said display control means causes energizing of still another of said bar-type display elements for indicating said relative levels simultaneously with the indication of said volume.

11. A receiver according to claim 10; in which said bar-type display elements for indicating said volume and said relative levels, respectively, are energized alternatively to said one bar-type display element for indicating the broadcast frequency.

12. A receiver according to claim 11; in which said bar-type display elements for indicating said volume and said relative levels, respectively, are selected from among groups of said display elements adjacent opposite ends of said row, respectively.

* * * * *